United States Patent [19]
Thompson et al.

[11] Patent Number: 6,020,244
[45] Date of Patent: Feb. 1, 2000

[54] CHANNEL DOPANT IMPLANTATION WITH AUTOMATIC COMPENSATION FOR VARIATIONS IN CRITICAL DIMENSION

[75] Inventors: Scott E. Thompson, Portland; Paul A. Packan; Tahir Ghani, both of Beaverton; Mark Stettler, Hillsboro; Shahriar S. Ahmed, Portland; Mark T. Bohr, Aloha, all of Oreg.

[73] Assignee: Intel Corporation, Santa Clara, Calif.

[21] Appl. No.: 08/777,552

[22] Filed: Dec. 30, 1996

[51] Int. Cl.[7] ................................................. H01L 21/336
[52] U.S. Cl. ....................... 438/302; 438/298; 438/185; 438/45
[58] Field of Search ..................... 438/302, 45, 185, 438/197, 298, 174

[56] References Cited

U.S. PATENT DOCUMENTS 5,320,974  6/1994  Hori et al. ................................. 438/302
5,543,337  8/1996  Yeh et al. ................................. 438/302
5,593,907  1/1997  Anjum et al. ............................ 438/302

OTHER PUBLICATIONS

A New Half–Micron p–Channel MOSFET with LATIPS (LArge–Tilt–Angle Implanted Punchthrough Stopper), Hori & Kurimoto, IEDM 88, geginning at p. 394.

Primary Examiner—Charles Bowers
Assistant Examiner—Craig Thompson
Attorney, Agent, or Firm—Blakely, Sokoloff, Taylor & Zafman LLP

[57] ABSTRACT

An improved well boosting implant which provides better characteristics than traditional halo implants particularly for short channel devices (e.g., 0.25 microns or less). In effect, an implant is distributed across the entire channel with higher concentrations occurring in the center of the channel of the devices having gate lengths less than the critical dimension. This is done by using very large tilt angles (e.g., 30–50°) with a relatively light dopant species and by using a relatively high energy when compared to the traditional halo implants.

10 Claims, 3 Drawing Sheets

CHANNEL DOPANT IMPLANTATION WITH AUTOMATIC COMPENSATION FOR VARIATIONS IN CRITICAL DIMENSION

BACKGROUND OF THE INVENTION

1. Field of the Invention

The invention relates to the fabrication of metal-oxide-semiconductor (MOS) field-effect transistors.

2. Prior Art

Various techniques have been used to implant the channel regions of MOS transistors to control short channel effects or to change other characteristics. One commonly used technique is a so called "halo" implant, where ions opposite in conductivity type to that used for the source region and drain region are implanted adjacent to these regions. These highly doped regions provide a higher punchthrough resistance including higher resistance to drain induced barrier lowering.

Often in the prior art the dopant for the halo regions is implanted with the wafer tilted after the gate is formed. This is shown in "A New Half-Micron p-Channel MOSFET with LATIPS (LArge-Tilt-Angle Implanted Punchthrough Stopper), by Hori and Kurimoto, *IEDM* 88, beginning at page 394.

SUMMARY OF THE INVENTION

An improved process is described used in the fabrication of an MOS device having a gate and source and drain regions of a first conductivity type which are formed in a substrate region of a second conductivity type. A dopant of the second conductivity type is implanted into the substrate so as to increase the dopant concentration of the second conductivity type dopant in the region generally midway between the source and drain regions as the gate lengths decrease. This is particularly useful since for a given critical dimension there are gate length variations resulting in some devices having gate lengths less than the critical dimension. These devices will have a higher concentration of the dopant and consequently improved punchthrough characteristics. This is achieved by ion implanting at approximately 30° or greater prior to the formation of the source and drain regions.

DETAILED DESCRIPTION OF THE PRESENT INVENTION

A process for providing well boosting which results in a threshold voltage rollup at shorter gate lengths is described. In the following description numerous specific details are set forth such as specific concentration levels, dopants, etc., in order to provide a thorough understanding of the present invention. It will be apparent to one skilled in the art that the present invention can be practiced without these specific details. In other instances well-known processing steps have not been set forth in detail in order not to obscure the present invention.

Figure 1:
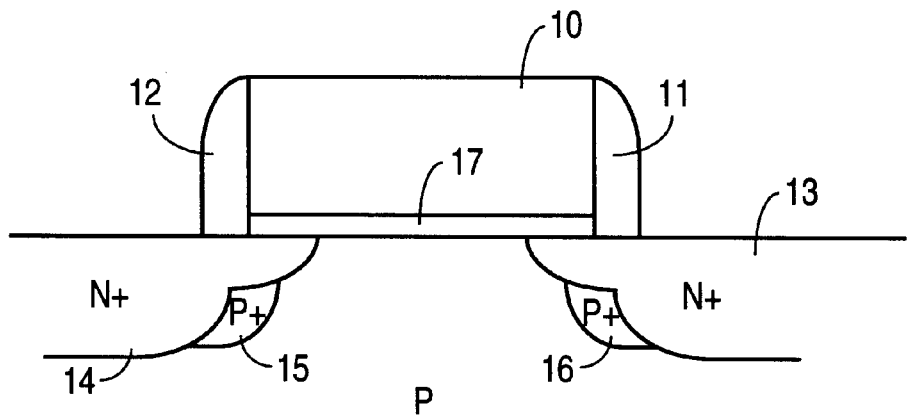
FIG. 1 is a cross sectional elevation view of a prior art n channel MOS transistor illustrating halo implants adjacent to source and drain region.

Referring to FIG. 1, in the cross sectional elevation view of a prior art MOS transistor formed in a p-type substrate or well, the gate 10 is insulated from the channel region of the transistor by the insulative layer 17. Spacers 11 and 12, formed on the opposite sides of the gate, are used to define the shallower extensions of the source and drain regions 13 and 14, as is well-known in the art. The halo regions 15 and 16 are, for example, formed by ion implantation prior to the doping of the source and drain regions by implanting a relatively heavy p-type dopant at two different angles so that the dopant lodges as shown. This results in the regions where the source and drain regions are subsequently formed from initially being doped with a p-type dopant. This, however, is overcome by counterdoping with a n-type dopant to form the n channel device shown in FIG. 1 but leaving the halo regions. As mentioned in the prior art section of this application, the halo regions 15 and 16 are used to improve the punchthrough characteristics of the transistor.

Figure 2:
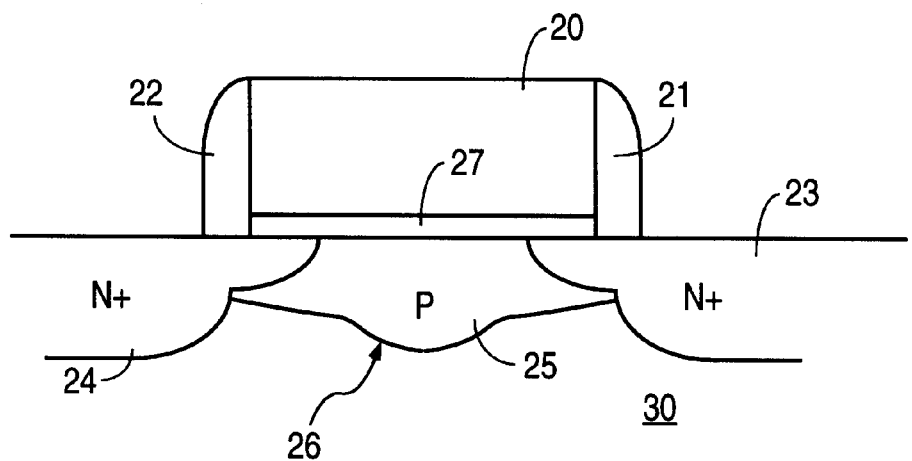
FIG. 2 is a cross sectional elevation view of an n channel transistor built in accordance with the present invention.

In FIG. 2 a field-effect transistor fabricated in accordance with the present invention is shown. As will be seen, the benefits of the present invention are best realized when the gate length of the gate 20 is approximately 0.25 microns or less. In the fabrication of the transistor of FIG. 2, a gate 20 is formed insulated from a substrate 30 by an insulative layer 27. For instance, the gate may be 0.22 microns in length, 0.25 microns in height and insulated from the substrate by a silicon dioxide layer 40 Å in thickness. The well boosting of the present invention is now formed as will be subsequently discussed. Then spacers 21 and 22 are formed along opposite sides of the polysilicon gate 20. The spacers are fabricated from a nonconductive material such as silicon nitride. The spacers, as was the case with the transistor of FIG. 1, are used to define the shallower extensions of the source and drain regions 23 and 24. Then, the source and drain regions are doped. Metal layers are next formed, as is well known, to complete the integrated circuit.

Instead of the halo regions of FIG. 1, the region 25 is used in accordance with the present invention in the transistor of FIG. 2. This p-type region is more heavily doped than the substrate or well in which the transistor of FIG. 2 is fabricated. Rather than having two separate halo regions below the source and drain extensions as shown in FIG. 1, with the present invention it is desirable to have, to the extent it can be achieved, more doping in the center part of the channel located under the gate oxide 27. This higher concentration of dopant is shown by the region 26 in FIG. 2. As will be seen, this occurs as the gate length decreases and is particularly useful in compensating for variations in the critical dimension. The doped region 25 represents the well boosting of the present invention and as will be seen provides, among other advantages, the threshold voltage rollup at shorter channel lengths which will described in conjunction with FIG. 4.

Figure 3:
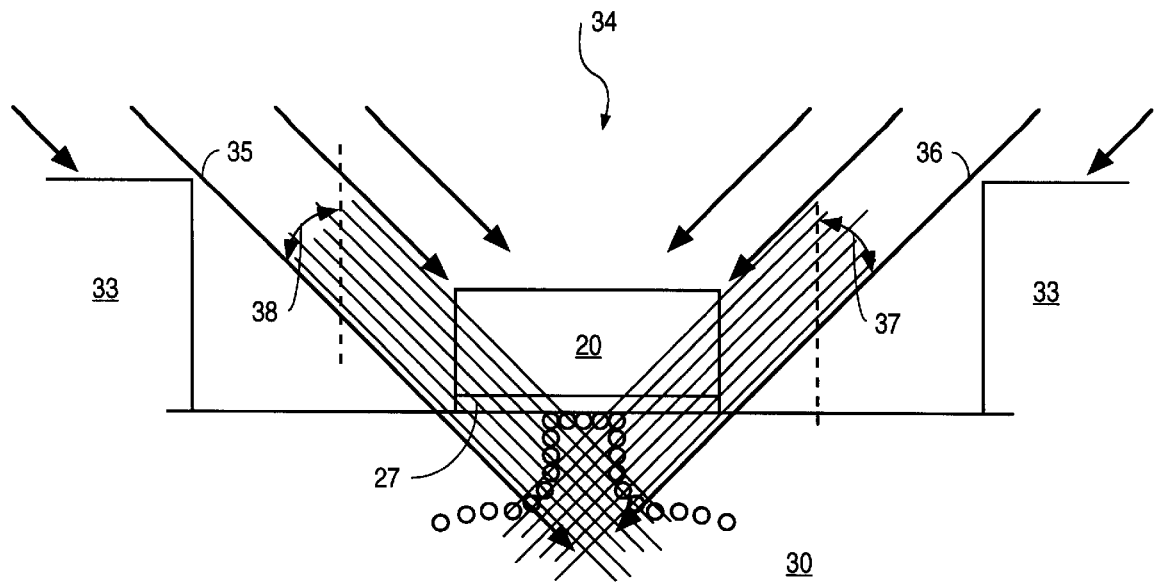
FIG. 3 is a cross sectional elevation view showing the processing step used to obtain the well boosting of the present invention.

Referring now to FIG. 3 the fabrication of the region 25 of FIG. 2 is shown. First, prior to the formation of the region 25 a gate insulative layer such as a silicon dioxide layer 27, is formed on the substrate. Following this, a gate typically fabricated from polycrystalline silicon (polysilicon) is formed on the insulative layer 27. The gate 20 is fabricated by masking and then etching a polysilicon layer. Now a photoresist layer 33 is exposed and developed to define the opening 34, this being the opening used for the well boosting implant of the present invention and for forming the extensions for the source and drain regions.

For the present invention, after forming the opening 34, the substrate on which the gate 20 is fabricated is subjected to ion implantation of an ion species having the same conductivity type as the region on which the transistor is fabricated. This region is generally a doped well formed in the bulk substrate for CMOS processes. For an n channel transistor, a p-type dopant is implanted into a p well 30. This implantation occurs at a very high tilt angle with respect to normal and preferably using a light dopant species implanted at a relatively high energy. This is done to force the dopant beneath the gate and into the central region of the channel.

With the present invention the dopant is implanted at an angle of 30° or greater, generally between 30° and 60°. This is illustrated in FIG. 3 where the dopant is first implanted at the angle 37, the trajectory of the implanted dopant is shown by the parallel lines 36. Then the angle is reversed and the dopant is implanted at the angle 38, the trajectory of the dopant is represented by the parallel lines 35. Both these angles are approximately 30° or greater. Generally since the transistors are fabricated along orthogonal lines, four implants are used, each 90° from each other with each implant occurring at a tilt angle of approximately 30° or more, such as the angles 37 and 38 of FIG. 3.

In a typical application for implanting boron, $B^{11}$ is implanted with four different implants, each at 90° with respect to one another with the substrate tilted at approximately 30° for each of the implants. A total dose of $2 \times 10^{13}$ from the four implants at an energy level of 10–20 KEV is used. This dopant is driven by a rapid thermal annealing (e.g., 900 to 1100° C. for 10 seconds) which occurs following the doping of the source and drain regions.

Following this well boosting implant, the source and drain regions for the transistor may be formed in a standard manner. For instance, a shallower implantation of an n-type dopant occurs to define the extensions to the source and drain regions. Then spacers are fabricated followed by the implantation and drive of an n-type dopant to define the main part of the source and drain regions. Alternatively, the extension for the source and drain regions may be diffused from a doped glass layer forming part of the spacers.

While not shown, in the fabrication of p channel transistors an n-type dopant such as arsenic or phosphorus is used and implanted at a very large tilt angle with relatively high energy to assure that the dopant concentration is greater in the central part of the channel region.

Figure 4:
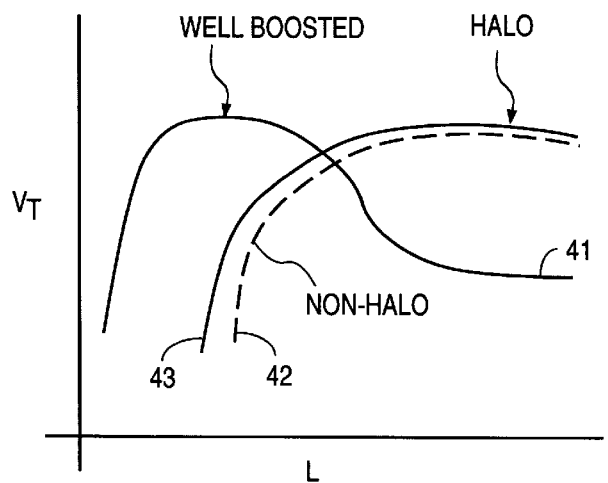
FIG. 4 is a graph showing the relationship of gate length versus threshold voltage for the prior art halo implant, prior art non-halo devices and the well boosted channel of the present invention.

Referring now to FIG. 4 the graph illustrates channel length (abscissa) versus threshold voltage (ordinate) for three processes. First, the dotted line 42 represents the characteristics of a transistor when no halo implantation is used. The curve 43 illustrates the characteristics when a halo implant as shown in FIG. 1 is used. As can be seen, both for the standard halo implant and the non-halo fabrication, there is a sharp rolloff in threshold voltage as the gate length decreases. The curve 41 shows the well boosting in accordance with the present invention. As can be seen from curve 41, a rollup of the threshold voltage occurs as the gate length decreases. This is significant since it allows the fabrication of devices with very short channel lengths (e.g., less than 0.1 microns) and provides a tolerance for variations in the critical dimension.

Figure 5:
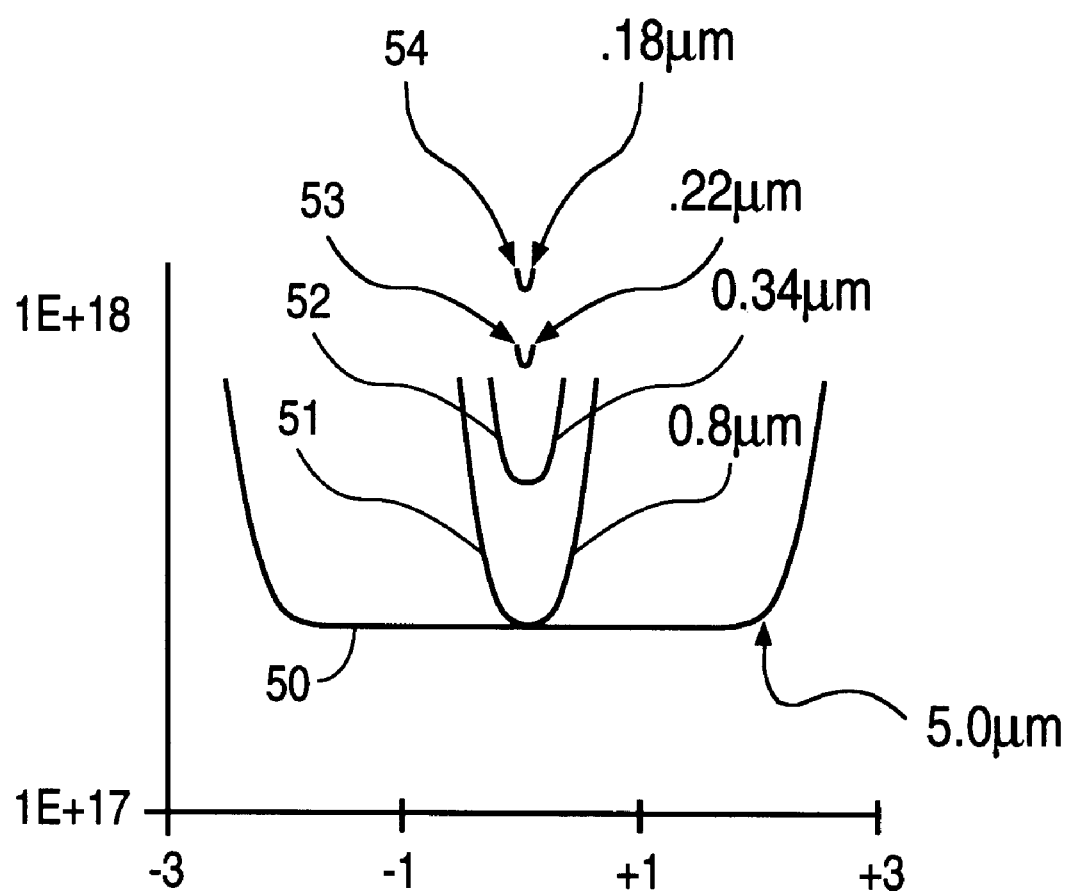
FIG. 5 is a graph illustrating the dopant concentration for the present invention in the channels of transistors of different gate lengths.

In fact the significant gain achieved by the present invention is not obtained unless the channel length is approximately 0.25 microns or smaller. This is illustrated in FIG. 5 where the dopant concentration across the channel for several gate lengths is shown after processing with the present invention. The curve 50 illustrates the dopant concentration for a 5 micron gate. As can be seen the higher dopant concentration is not in the center of the channel but rather on the edges of the channel. Similarly, the curve 51 for a 0.8 micron gate length again shows a dip in the dopant concentration level in the center of the channel. However, as the gate length decreases the concentration in the center of the channel increases. Curve 52, representing a 0.3 micron gate, illustrates that the concentration is higher in the center of the channel than for the 0.8 micron gate case. The curve 53 demonstrates that for a gate length of 0.22 microns there is a relatively high dopant concentration across the entire channel when compared to, for example, the 5 micron gate. Finally curve 54 shows that for a gate length of 0.18 microns there is even higher doping in the channel. Thus, the best results of the present invention are obtained when the gate length is, for instance, approximately 0.25 micron or less. As mentioned earlier, ideally the highest concentration across the channel should be in the center of the channel and not under the source and drain extensions.

One significant advantage to the present invention is the fact that for a given implant dose, a higher concentration occurs for the shorter gate lengths. Thus, where the critical dimension is 0.22 microns (gate length) it is expected that variations will occur where some gate lengths will be, for instance, 0.18 microns. As can be seen in FIG. 5, the channels of these 0.18 micron devices will be more highly doped thereby providing compensation for the variation in the critical dimensions. This higher doping for the shorter gate lengths would not occur if, for example, the channels are implanted before the gates are formed.

Thus, a well boosting process has been described which provides a threshold voltage rollup at shorter gate lengths, in addition to providing the more traditional benefits from halo implants such as lowering source to drain leakage current and improved punchthrough characteristics. Additionally, it has been found that the high frequency characteristics of the transistors are improved with the well boosting implants of the present invention.

We claim:

1. In the fabrication of MOS devices each having a gate and spacers where the source and drain regions of a first conductivity type are formed in a substrate region of a second conductivity type and where the gates have a nominal gate length of l and some of the gates have a length less than l, an improved process wherein a dopant of the second conductivity type is implanted into the substrate at an angle of approximately 30° or greater with respect to a normal from the substrate so as to increase the doping concentration of the second conductivity type dopant in the region generally midway between the source and drain regions as the gate lengths decrease, the implantation being performed prior to the formation of the source and drain regions and spacers such that the devices having a gate length less than l have a higher doping concentration of the second conductivity dopant in the region midway between the source and drain region than the device having a gate length of l.

2. The process defined by claim 1 wherein the implantation occurs in four steps each with the substrate tilted at approximately 30° or greater.

3. In the fabrication of MOS devices having a gate, spacers and source and drain regions of a first conductivity type dopant with a nominal gate length of l where some of the devices have gate lengths of less than l, an improvement where the channels under the gates are doped by ion implanting under the gates prior to the formation of the source and drain regions and spacers with a dopant of a second conductivity type and where there is a higher dopant concentration of the second conductivity type dopant as a result of the ion implantation under the gates of the devices having the gate length less than l as compared to the doping concentration of the second conductivity type dopant under the gates of the devices having a gate length of l.

4. A process for forming transistors in first conductivity type substrate regions comprising the steps of:

forming gates insulated from the substrate regions, the gates having a nominal length l and some of the gates having a gate length less than l;

implanting a dopant of the first conductivity type into the substrate under the gates at an angle of approximately 30° or greater with respect to a normal from the substrate prior to formation of source and drain regions and spacers, such that the transistors having a gate length of less than l have a higher dopant concentration of the first conductivity type dopant under the gate than the transistor having a gate length of l; and forming spacers, and source and drain regions of a second conductivity type dopant after the preceding step of implanting the dopant under the gates.

5. The process defined by claim 4 wherein the implanted, first conductivity type dopant, comprises $B_{11}$ implanted at an energy of approximately 15 KeV or greater.

6. The process defined by claim 4 wherein the implanted, first conductivity type dopant, comprises phosphorus.

7. The process defined by claim 4 wherein the implanted, first conductivity type dopant, comprises arsenic.

8. The process defined by claim 4 wherein the gates have the nominal length of approximately 0.25 microns or less.

9. The process defined by claim 5 wherein the gates have the nominal length of approximately 0.25 microns or less.

10. The process defined by claim 6 wherein the gates have the nominal length of approximately 0.25 microns or less.

* * * * *

UNITED STATES PATENT AND TRADEMARK OFFICE
CERTIFICATE OF CORRECTION

PATENT NO. : 6,020,244
DATED : February 1, 2000
INVENTOR(S) : Thompson, et. al.

It is certified that error appears in the above-identified patent and that said Letters Patent is hereby corrected as shown below:

In column 4, at line 50, after "length of" delete " l " and insert -- $\ell$ --.
In column 4, at line 51, after "than" delete " l " and insert -- $\ell$ --.
In column 4, at line 60, delete " l " and insert -- $\ell$ --.
In column 4, at line 62, after "length of " delete " l " and insert -- $\ell$ --.
In column 5, at line 1, after "length of" delete " l " and insert -- $\ell$ --.
In column 5, at line 2, after "than" delete " l " and insert -- $\ell$ --.
In column 5, at line 9, after "than" delete " l " and insert -- $\ell$ --.
In column 5, at line 11, after "length of " delete " l " and insert -- $\ell$ --.
In column 5, at line 15, after "length" delete " l " and insert -- $\ell$ --.
In column 5, at line 16, after "than" delete " l " and insert -- $\ell$ --.
In column 6, at line 1, after "than" delete " l " and insert -- $\ell$ --.
In column 6, at line 3, after "of" delete " l " and insert -- $\ell$ --.
In column 6, at line 8, delete "$B_{11}$" and insert -- $B^{11}$ --.
In column 6, at line 11, delete "KeV" and insert --KV--.

Signed and Sealed this

First Day of May, 2001

Attest:

NICHOLAS P. GODICI

*Attesting Officer*     *Acting Director of the United States Patent and Trademark Office*